United States Patent [19]
Hojo et al.

[11] Patent Number: 5,952,850
[45] Date of Patent: Sep. 14, 1999

[54] INPUT/OUTPUT CIRCUIT AND A METHOD FOR CONTROLLING AN INPUT/OUTPUT SIGNAL

[75] Inventors: Takehiko Hojo; Motohiro Enkaku, both of Kanagawa-ken, Japan

[73] Assignee: Kabushiki Kaisha Toshiba, Japan

[21] Appl. No.: 08/937,123

[22] Filed: Sep. 24, 1997

[30] Foreign Application Priority Data

Sep. 25, 1996 [JP] Japan .................................. 8-253204

[51] Int. Cl.⁶ .................. H03K 19/0175; H03K 19/094
[52] U.S. Cl. ................................ 326/83; 326/57; 326/86
[58] Field of Search ................................ 326/83, 86, 87, 326/57, 58, 33

[56] References Cited

U.S. PATENT DOCUMENTS

| | | | |
|---|---|---|---|
| 5,306,965 | 4/1994 | Asprey | 326/83 |
| 5,530,377 | 6/1996 | Walls | 326/86 |
| 5,532,621 | 7/1996 | Kobayashi et al. | 326/86 |
| 5,614,842 | 3/1997 | Doke et al. | 326/58 |

FOREIGN PATENT DOCUMENTS 401174009  7/1989  Japan ...................................... 326/83

*Primary Examiner*—Michael Tokar
*Assistant Examiner*—Daniel D. Chang
*Attorney, Agent, or Firm*—Banner & Witcoff, Ltd.

[57] ABSTRACT

An I/O circuit is capable of achieving a reduction of power consumption by preventing leak current while performing the pull-down or pull-up operation. The I/O circuit of the present invention is constructed so that an I/O terminal 5 is pulled down or pulled up only when the I/O terminal 5 is in an open state or at the same potential as the pull-down or pull-up potential provided to the I/O terminal 5 when the high impedance state is input to the I/O terminal 5. The I/O circuit comprises an output circuit providing tri-state outputs, a switch circuit for the pull-up or pull-down operation, and an input circuit connected to the I/O terminal, the switch circuit and internal circuits of a device.

5 Claims, 5 Drawing Sheets

INPUT/OUTPUT CIRCUIT AND A METHOD FOR CONTROLLING AN INPUT/OUTPUT SIGNAL

BACKGROUND OF THE INVENTION

1. Field of the Invention

The present invention relates to an input/output (I/O) circuit which is capable of providing tri-state outputs and, particularly, to an I/O circuit which performs a pull-down/ pull-up operation when a high impedance is output, and to a control method for controlling the I/O circuit.

2. Description of the Related Art

A known circuit configuration is shown in FIG. 7 or FIG. 8 comprising a conventional I/O circuit for providing tri-state outputs.

An I/O circuit shown in FIG. 7 outputs three states of low level, high level or high impedance state to an I/O terminal 103 by controlling an output buffer 100. The output buffer 100 comprises a P-channel Field Effect Transistor (FET) and an N-channel FET directly connected to each other in series between a high level power source S and a low level power source (for example, ground) G by an output control circuit 102. The output control circuit 102 comprises one or more logic gates (for example, logic circuits shown in FIG. 7) operating with a signal provided to output control terminals 101. The I/O circuit receives an input signal provided from, for instance, a bus connected to the I/O terminal 103 to an internal circuit via a protective resistor 107 and an input buffer 104. Further, a pull-down resistor 105 is connected to the I/O terminal 103 of the I/O circuit to pull it down to ground potential when the I/O terminal 103 becomes the high impedance state.

In the I/O circuit in such a structure, when a high level signal is provided to the I/O terminal 103, the current continues to flow to the ground G from the I/O terminal 103 via the protective resistor 107 and the pull-down resistor 105. Although the amount of the current decreases if this pull-down resistor 105 is has high resistance value, the current still continues to flow a little. Therefore, the power consumption increases and with the increase of the number of I/O circuits, the increase in power consumption becomes remarkable. Further, when the pull-down resistor 105 is integrated to have a high resistance, a large space is required for forming the integrated resistors on the semiconductor chip, resulting in a drop in the degree of integration.

An I/O circuit shown in FIG. 8 connects a pull-up resistor 106 to the I/O terminal 103 which pulls up the I/O terminal 103 to a high level power source S when the I/O terminal 103 becomes the high impedance state. The rest of the structure is the same as that shown in FIG. 7.

In such a structure, when a low level signal is provided to the I/O terminal 103, the current flows continuously to the I/O terminal 103 from the high level power source S via the protective resistor 107 and the pull-up resistor 106. If this pull-up resistor 106 is at a sufficiently high resistance value, the amount of current decreases, but current still continues to flow. Therefore, the same problem as that in the I/O circuit shown in FIG. 7 also arises in this I/O circuit.

There is also an I/O circuit (not shown) in which an N-channel FET is applied as a pull-down means instead of the pull-down resistor 105 shown in FIG. 7. The N-channel FET is switched by a control signal that controls the output buffer 100 and this FET is turned on only when the I/O circuit 103 becomes the high impedance state. Even in this structure, when a high level signal is provided to the I/O circuit 103 and the I/O terminal 103 becomes the high impedance state, the current flows in the N-channel FET the same as in the pull-down resistor 105 in FIG. 7. Thus, the power consumption will increase. Also, the same problem exists in a structure wherein, for instance, a P-channel FET which is switched by a control signal that controls the output buffer 100 is applied as a pull-up means instead of the pull-up resistor 106 shown in FIG. 8 so as to turn this FET on only when the I/O terminal 103 becomes the high impedance state.

As described above, in a conventional I/O circuit which performs the pull-down/pull-up operation, when a low level or high level signal is provided to an I/O terminal, the current flows continuously between the I/O terminal and a low level or high level power source through a structure to perform pull-down or pull-up operation, namely the N-channel FET and the P-channel FET. Therefore, an increase in the power consumption in I/O circuits of the prior art cannot be avoided.

SUMMARY OF THE INVENTION

The purpose of the present invention is to provide an I/O circuit that is capable of reducing power consumption while performing a pull-down or pull-up operation when an I/O terminal is in an open state or a high impedance state, and a control method for controlling an I/O circuit.

The novel invention provides an input/output circuit of a semiconductor device comprising: an output circuit which outputs a state of a first level or a state of a second level different from the first level or a high impedance state, the output circuit having a control means to control the output states and having an output terminal; an input/output terminal connected to the output terminal of the output circuit; an input circuit having an input terminal connected to the input/output terminal and an output terminal connected to internal circuits; and a switch circuit connected between the input/output terminal and a power source supplying the first level, having a switching node connected to the output terminal of the input circuit; wherein the switch circuit turns on when the input/output terminal is provided the state of the first level or when the input/output terminal is open state and the output circuit outputs the high impedance state; and the switch circuit turns off when the input/output terminal is provided the state of the second level.

And the present invention provides an input/output circuit of a semiconductor device comprising: an output circuit which outputs a state of a first level state or a state of a second level different from the first level or a high impedance state, the output circuit having a control means to control the output states and an output terminal; an input/ output terminal connected to the output terminal of the output circuit; an input circuit having an input terminal connected to the input/output terminal and an output terminal connected to internal circuits; a switch circuit connected between the input/output terminal and a power source supplying a first level; and a controller connected between the input/output terminal and the switch circuit; wherein the switch circuit turns on when the input/output terminal is provided the state of the first level or when the input/output terminal is open state and the output circuit outputs the high impedance state, and the switch circuit turns off when the input/output terminal is provided the second level.

The present invention provides a method for controlling an input/output circuit of a semiconductor device, having an input/output terminal, an input circuit whose input terminal is connected to the input/output terminal and whose output terminal is connected to internal circuits, a switch circuit connected between the input/output terminal and a power source of a first level and having a control terminal, and an output circuit whose output terminal is connected to the input/output terminal and which outputs a state of the first level, a state of a second level and a high impedance state, comprising the steps of: detecting a level state of the input/output terminal; and controlling the switch circuit to turn off when the input/output terminal is the second level, and to turn on when the input/output terminal is not the second level.

And the present invention provides a method for controlling an input/output circuit of a semiconductor device, having an input/output terminal, an input circuit whose input terminal is connected to the input/output terminal and whose output terminal is connected to internal circuits, a switch circuit connected between the input/output terminal and a power source of a first level and having a control terminal, and an output circuit whose output terminal is connected to the input/output terminal and which outputs a state of the first level, a state of a second level and a high impedance state, comprising the steps of: outputting the high impedance state from the output circuit; detecting a level state of the input/output terminal; and controlling the switch circuit to turn off when the input/output terminal is the second level, to turn on when the input/output terminal is the first level, and to turn on gently when the input/output terminal is an intermediate level state.

Further, the present invention provides a method for controlling an input/output circuit of a semiconductor device, having an input/output terminal, a switch circuit connected between the input/output terminal and a power source of a first level state and having a control terminal, a controller whose input terminal is connected to the input/output terminal and whose output terminal is connected to the control terminal of the switch circuit, an output circuit whose output terminal is connected to the input/output terminal and which outputs a state of the first level, a state of a second level and a high impedance state, and an input circuit connected between the input/output terminal and internal circuits, comprising the steps of: detecting a level of the input/output terminal by the controller; and controlling the switch circuit to turn off when the input/output terminal is the second level, and to turn on when the input/output terminal is not the second level.

DETAILED DESCRIPTION OF THE PREFERRED EMBODIMENTS

Six embodiments of an input/output circuit of the present invention for providing reduced power consumption and improved control will be described with reference to FIGS. 1–6.

Embodiment 1

Figure 1:
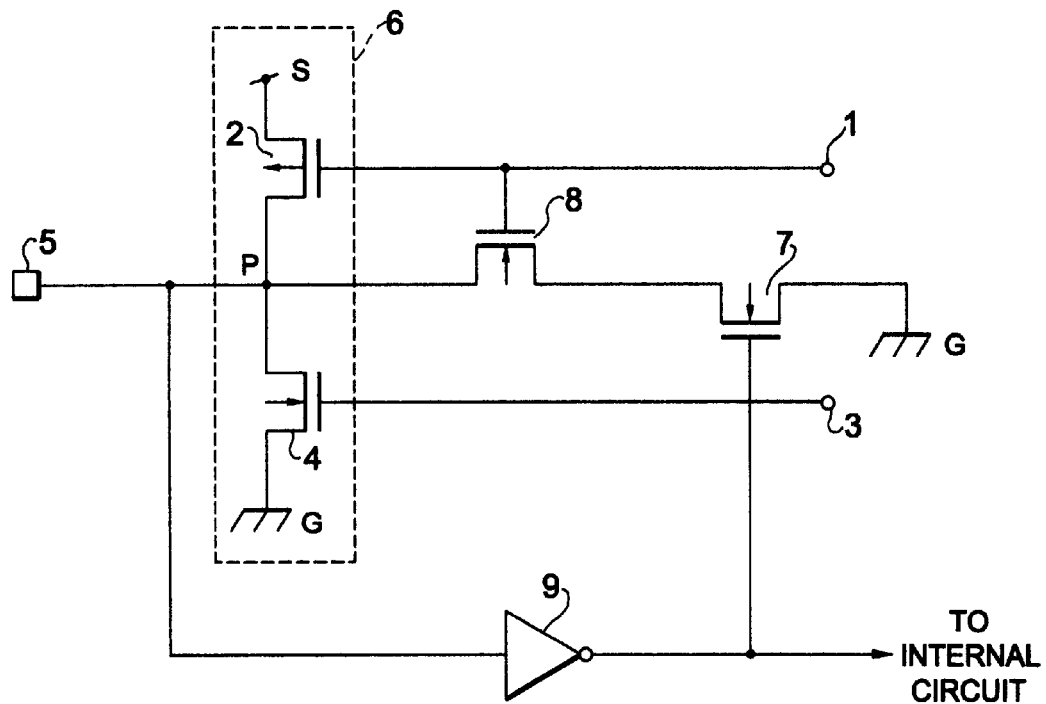
FIG. 1 is a diagram of a first embodiment of an I/O circuit according to the present invention.

FIG. 1 is a diagram of a first embodiment of an I/O circuit of the present invention.

In FIG. 1, an I/O circuit has a tri-state output circuit 6 which outputs a low level or high level or high impedance state to an I/O terminal 5. The output circuit 6 consists of a P-channel FET 2 whose gate is connected to a first output control terminal 1 and an N-channel FET 4 whose gate is connected to a second output control terminal 3. Both the FET 2 and the FET 4 are connected to each other in series between a high level power source S and a low level power source (ground) G, the in-series connecting point P connected to the I/O terminal 5.

The I/O circuit has a first switch, such as an N-channel FET 7, to selectively supply a low level pull-down potential (ground potential) G to the I/O terminal 5. In addition, this I/O circuit has a second switch, such as an N-channel FET 8 whose gate is connected to the first output control terminal 1. N-channel FET 8 is inserted between the I/O terminal 5 and the first switch, the N-channel FET 7. The second switch, the N-channel FET 8, is controlled to the OFF state when the output circuit 6 outputs a high level signal to the I/O terminal 5. It is controlled to the ON state when the output circuit 6 outputs a low level signal or a high impedance state to the I/O terminal 5. Further, the I/O circuit has an input circuit, such as an inverter 9, whose input terminal is connected to the I/O terminal 5 and whose output terminal is connected to the gate of the FET 7 and to internal circuits such as a micro processor unit MPU. The input circuit inputs a signal provided to the I/O terminal 5 to the internal circuits and functions as a level detector for the I/O terminal 5. And the input circuit 9 turns off the first switch when the I/O terminal 5 is a high level signal, namely a different level from the pull-down level. The input circuit 9 turns on the first switch 7 when the I/O terminal 5 is a low signal level, namely the same level as the pull-down level provided by the first switch 7 or when the output circuit 6 outputs the high impedance state and the I/O terminal 5 is in the open state.

The output circuit 6 outputs the low level signal to the I/O terminal 5 when a high level signal is applied to the first output control terminal 1 and the second control terminal 3, and outputs a high level signal to the I/O terminal 5 when a low level signal is applied to the first output control terminal 1 and to the second output control terminal 3. The output circuit 6 outputs a high impedance state to the I/O terminal 5 when a high level signal is applied to the first output control terminal 1 and a low level signal is applied to the second output control terminal 3.

When the I/O terminal 5 becomes a high impedance state, the potential at the I/O terminal 5 becomes an intermediate potential level (hereinafter referred to as the intermediate level) between the high level power source potential S and the low level power source potential G by the leak current flowing into the I/O terminal 5 or the leak current flowing out therefrom. The input circuit 9 has an input threshold potential set at the intermediate level. That is, when the input circuit 9 is an inverter consisting of a P-channel FET and an N-channel FET, both FETs are actually turned ON when the intermediate level is provided to the input of the input circuit 9. Although inverters are typically used to output high levels or low levels, inverters may also be used to output intermediate levels when they receive input potentials near the threshold levels. Thus the output of the input circuit 9 may become nearly an intermediate potential, like the intermediate potential. Because the first switch 7 is in a non-saturated state and is gently turned ON, current begins to flow to the low level power source G from the I/O terminal 5 via this first switch 7 and the second switch 8, is now in an ON state because of a high level signal provided to the first output control terminal 1. When current begins to flow through the first switch 7 to the low level power source G, the amount of current is small because the FET 7 is in a non-saturated state, so that the potential of the I/O terminal 5 begins to gradually drop. When the current to the low level power source G from the I/O terminal 5 increases and the potential of the I/O terminal 5 drops sufficiently, the input circuit 9 outputs a high level signal. As a result, the first switch 7 is turned ON in its saturated state and the I/O terminal 5 is fixed at the pull-down potential of the low level power source. Thus, when the output circuit 6 outputs a high impedance state and the I/O terminal 5 is in an open state, the I/O terminal 5 is pulled down to a low level.

If a low level signal is further provided to the I/O terminal 5 from an external source in addition to the above situation, the output circuit 6 holds the high impedance state, and the low level signal provided to the I/O terminal 5 is inverted and transferred into the internal circuits through the input circuit 9. On the other hand, if a high level signal is provided to the I/O terminal 5, the pull-down operation of the I/O terminal 5 is inhibited due to the output of the inverter 9 being inverted to the low level and the first switch 7 is turned OFF. It is possible to invert the output of the inverter 9 rapidly by reducing the current volume flowing into the low level power source from the I/O terminal 5 via the FET 7 and the FET 8. To reduce the current, the ON resistance of the FET 8 may be relatively large by making the transistor size of the FET 8 small.

FET 8 is not required if the input circuit 9 outputs an inverted signal, when a high level signal is impressed to the I/O terminal 5 in the pulled down state, due to design considerations of selecting the size of the first switch 7 and the capability of the input circuit 9.

As described above, in the case when the output circuit 6 outputs the high impedance state to the I/O terminal 5, the I/O terminal 5 is pulled down only when the I/O terminal 5 is in the open state or a low level signal is being applied thereto. On the other hand, when a high level signal is applied to the I/O terminal 5, the pull-down operation of the I/O terminal 5 is inhibited, even if the output circuit 6 outputs a high impedance state to the I/O terminal 5. Accordingly, when the high impedance state is output to the I/O terminal 5 from the output circuit 6, leak current is prevented and power consumption can be reduced significantly when compared with a conventional I/O circuit which performs the pull-down operation irrespective of a signal applied to the I/O terminal 5.

Embodiment 2

Figure 2:
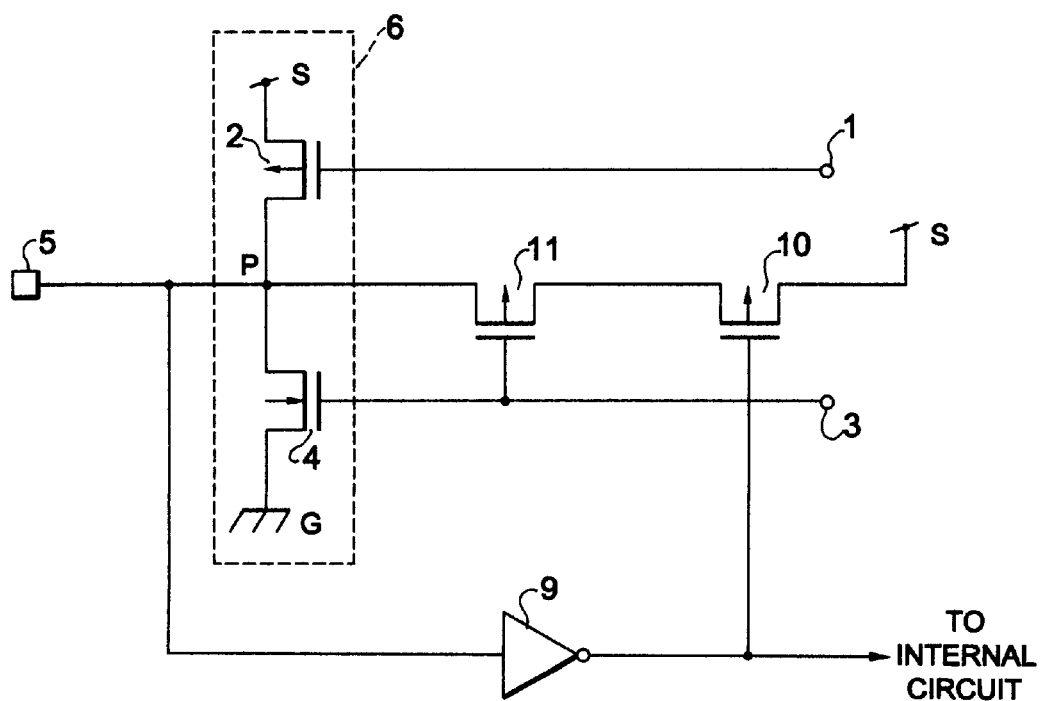
FIG. 2 is a diagram of a second embodiment of an I/O circuit according to the present invention.

FIG. 2 is a diagram of a second embodiment of an I/O circuit of the present invention.

Figure 7:
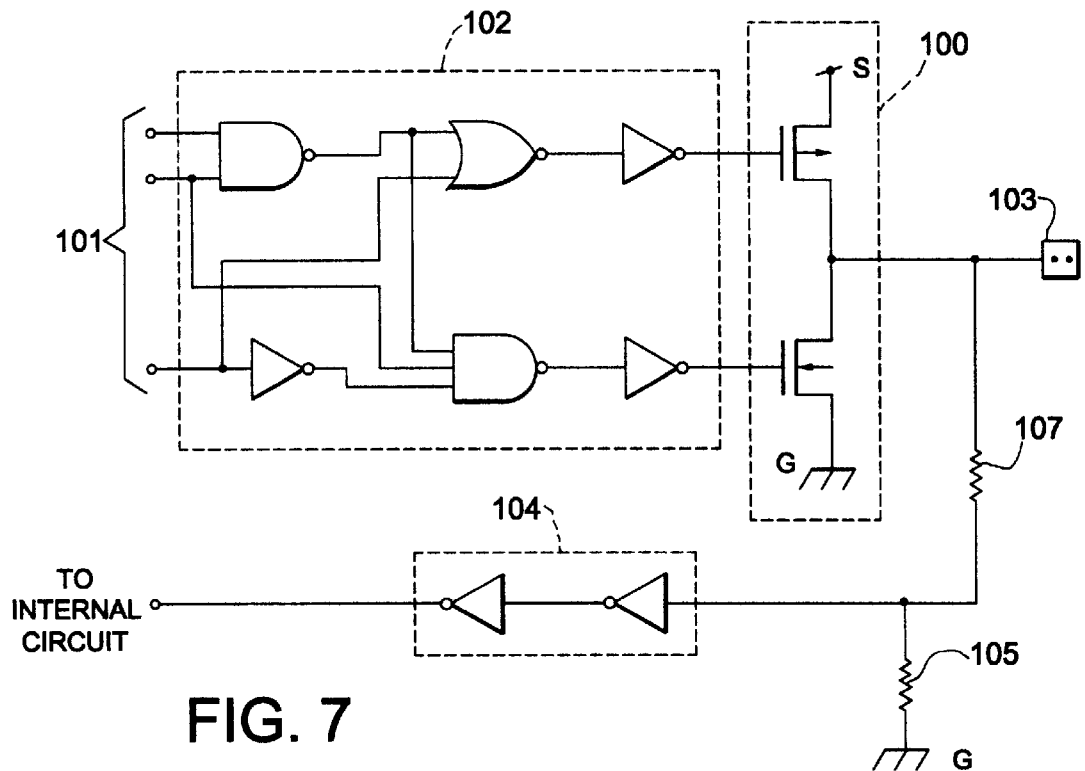
FIG. 7 is a diagram of a conventional I/O circuit.
Figure 8:
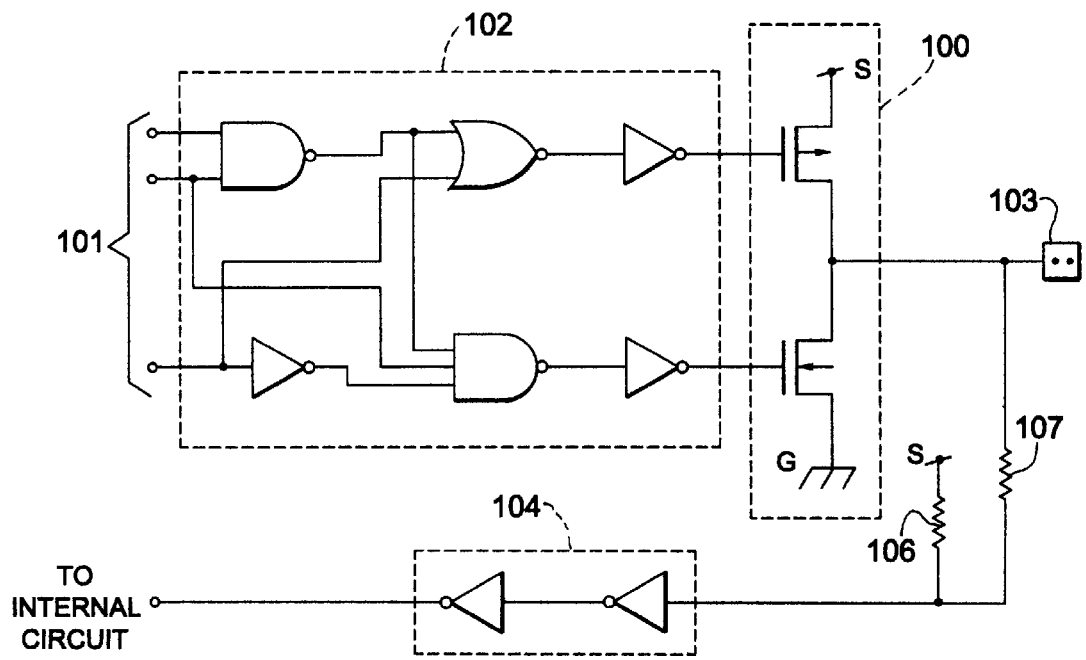
FIG. 8 is a diagram of another conventional I/O circuit.

This embodiment features that, contrary to the first embodiment shown in FIG. 1, a P-channel FET 10 is used instead of the N-channel FET 7 shown in FIG. 7 and a P-channel FET 11 is used instead of the N-channel FET 8. Also, the I/O terminal 5 is pulled up to a high level power source S, but the rest of the circuit configuration and the operation are the same as those in the first embodiment shown in FIG. 1.

Thus, the same benefits as in the first embodiment shown in FIG. 1 can be attained in this embodiment. Namely, only when the high impedance state is input to the I/O terminal 5 and the I/O terminal 5 is in the open state or the same potential level as pull-up potential is provided to the I/O terminal, the I/O terminal 5 is pulled up. Therefore leak current in the pull-down or pull-up operation can be prevented and power consumption reduces.

Embodiment 3

Figure 3:
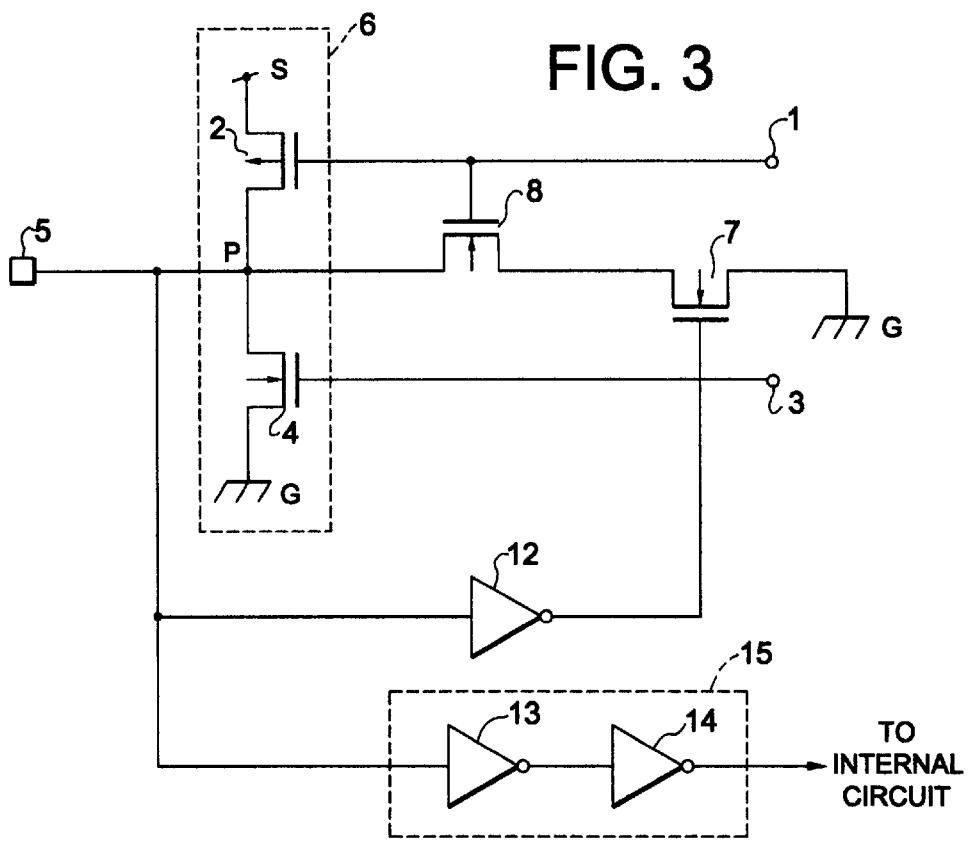
FIG. 3 is a diagram of a third embodiment of an I/O circuit according to the present invention.

FIG. 3 is a diagram of a third embodiment of an I/O circuit of the present invention.

This embodiment features a controller 12, such as an inverter, which has an input threshold set at a higher level than the potential level of the high impedance state of the output circuit 6, and an input circuit 15 consisting of inverters 13 and 14 connected to each other in series instead of the input circuit 9 in the first embodiment. The controller 12 works as a level detector to turn the first switch 7 ON by detecting the potential level of the I/O terminal 5. When the output circuit 6 outputs the high impedance state and the I/O terminal 5 is in the open state, the controller 12 turns the first switch 7 ON rapidly, compared with the configuration of the first embodiment as shown in FG. 1.

In addition to the same benefits of the first embodiment as shown in FIG. 1, power consumption is reduced until the I/O terminal 5 is pulled down by reducing a time until it is pulled down. Namely, according to the present invention, only when the high impedance state is input to the I/O terminal 5 and the I/O terminal 5 is in an open state or the same potential level as a pull-down potential is provided to the I/O terminal, the I/O terminal 5 is pulled down. Therefore leak current in the pull-down operation can be prevented and power consumption is reduced.

Embodiment 4

Figure 4:
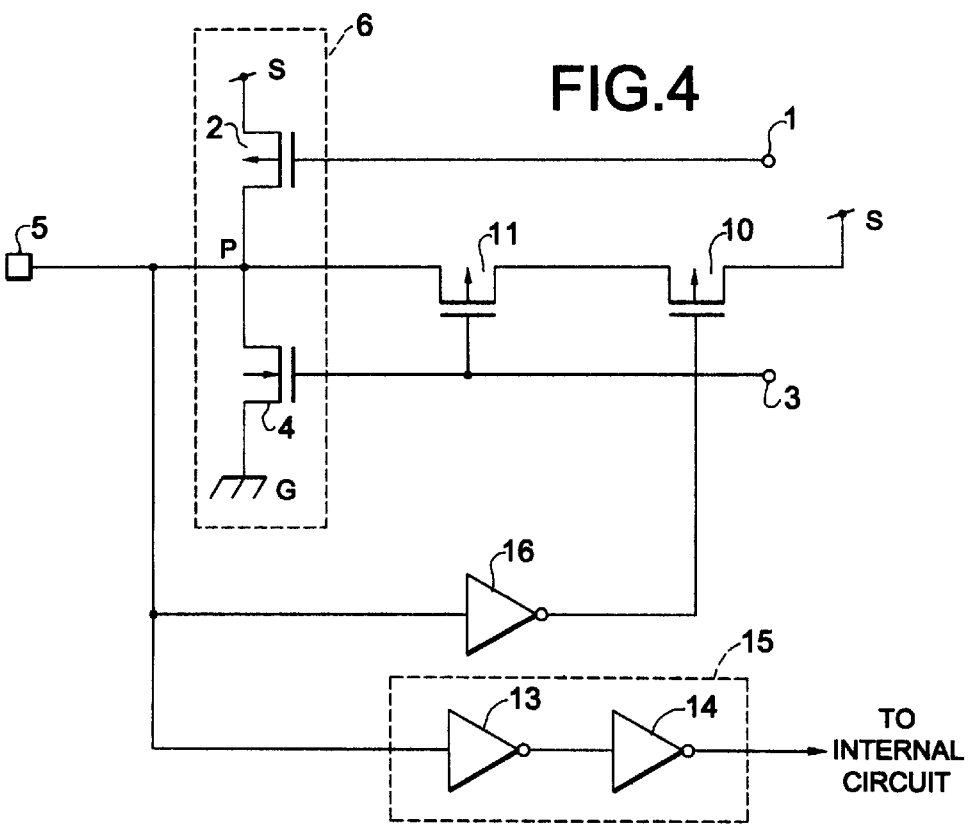
FIG. 4 is a diagram of a fourth embodiment of an I/O circuit according to the present invention.

FIG. 4 is a diagram of the fourth embodiment of an I/O circuit of the present invention.

This embodiment features an inverter 16 which has an input threshold set at a lower level than the potential level of the high impedance state of the output circuit 6, and an input circuit 15 consist of inverters 13 and 14 connected to each other in series instead of the inverter 9 in the second embodiment. The controller 16 works as a level detector to turn the FET 10 ON by detecting the potential level of the I/O terminal 5. When the output circuit 6 outputs the high impedance state and the I/O terminal 5 is in an open state, the controller 16 turns the FET 10 ON rapidly, compared with the configuration of the second embodiment as shown in FIG. 2.

In addition to the same benefits of the second embodiment shown in FIG. 2, it is possible to reduce power consumption until the I/O terminal 5 is pulled up by reducing the time until it is pulled up. Namely, according to the present invention, only when the high impedance state is input to the I/O terminal 5 and the I/O terminal 5 is in the open state or the same potential level as pull-up potential is provided to the I/O terminal, the I/O terminal 5 is pulled up. Therefore leak current in the pull-down or pull-up operation can be prevented and the power consumption is reduced.

Embodiment 5

FIG. 5 is a diagram of two variations of a fifth embodiment of an I/O circuit of the present invention.

Figure 5A:
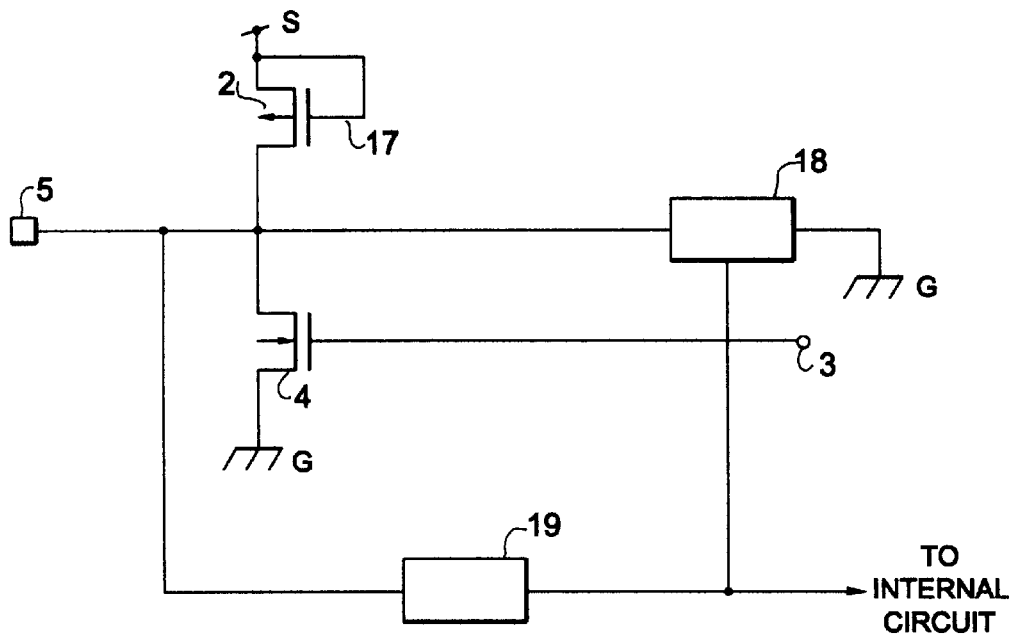
FIG. 5 is a diagram of a fifth embodiment of an I/O circuit according to the present invention.

This embodiment features, as shown in FIG. 5(a), an open drain type output circuit comprising a FET 17 whose gate is connected to its source terminal, a switch circuit 18 performing the same function as that of the FET 7 in FIG. 1, an input circuit 19 performing the same function as that of the inverter 9 in FIG. 1 and the FET 8 is deleted.

Figure 5B:
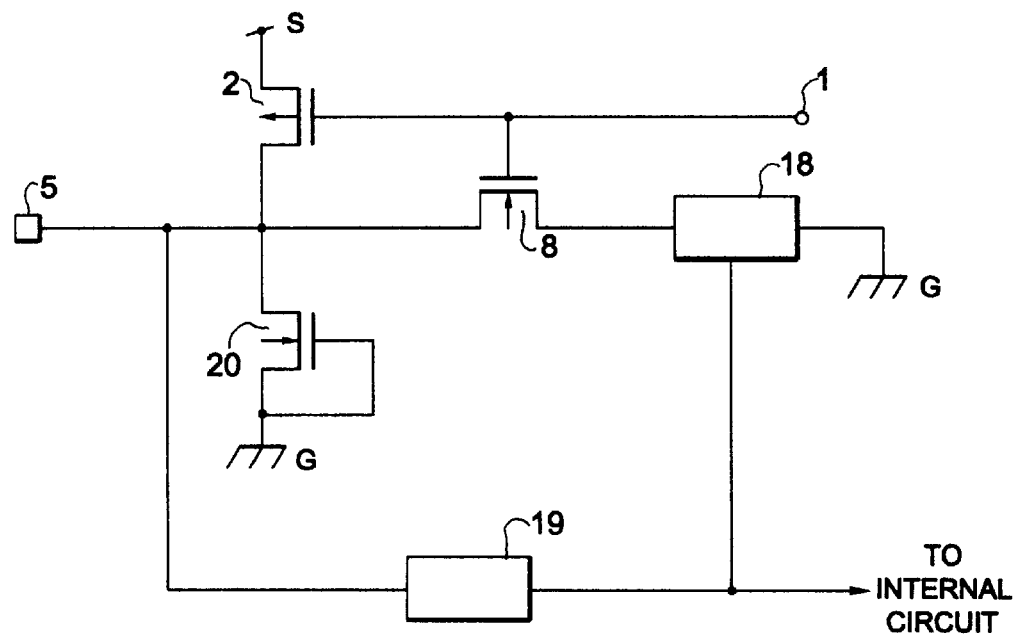

In the second variation, as shown in FIG. 5(b), an open drain type output circuit comprising a FET 20 whose gate is connected to its source terminal, a switch circuit 18 having the same function as the FET 7 in FIG. 1 and an input circuit 19 performing the same function as that of the inverter 9 in FIG. 1.

The I/O circuit variations of this embodiment attain the same advantages as those of the first embodiment shown in FIG. 1. Namely, according to the present invention, only when the high impedance state is input to the I/O terminal 5 and the I/O terminal 5 is in an open state or the same potential level as the pull-down potential is provided to the I/O terminal, the I/O terminal 5 is pulled down. Therefore leak current in the pull-down operation can be prevented and power consumption is reduced.

Embodiment 6

FIG. 6 is a diagram of two variations of a sixth embodiment of an I/O circuit of the present invention.

Figure 6A:
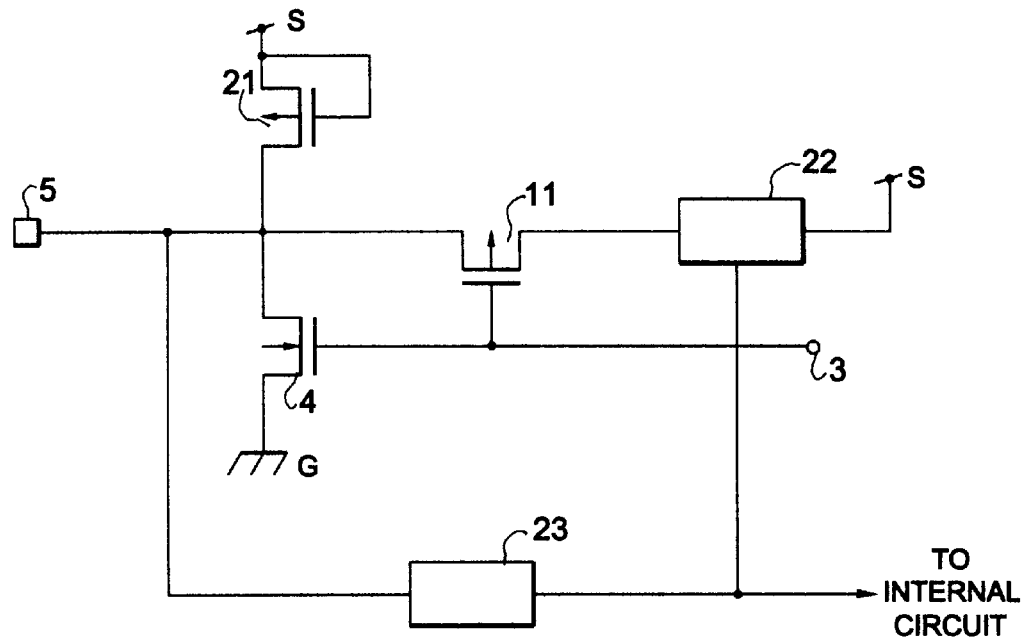
FIG. 6 is a diagram of a sixth embodiment of an I/O circuit according to the present invention.

This embodiment features, as shown in FIG. 6(a), an open drain tppe output circuit comprising an FET 21 whose gate is connected at its source terminal, a switch circuit 22 performing the same function as that of the FET 10 shown in FIG. 2 and an input circuit 23 performing the same function as that of the inverter 9 shown in FIG. 2.

Figure 6B:
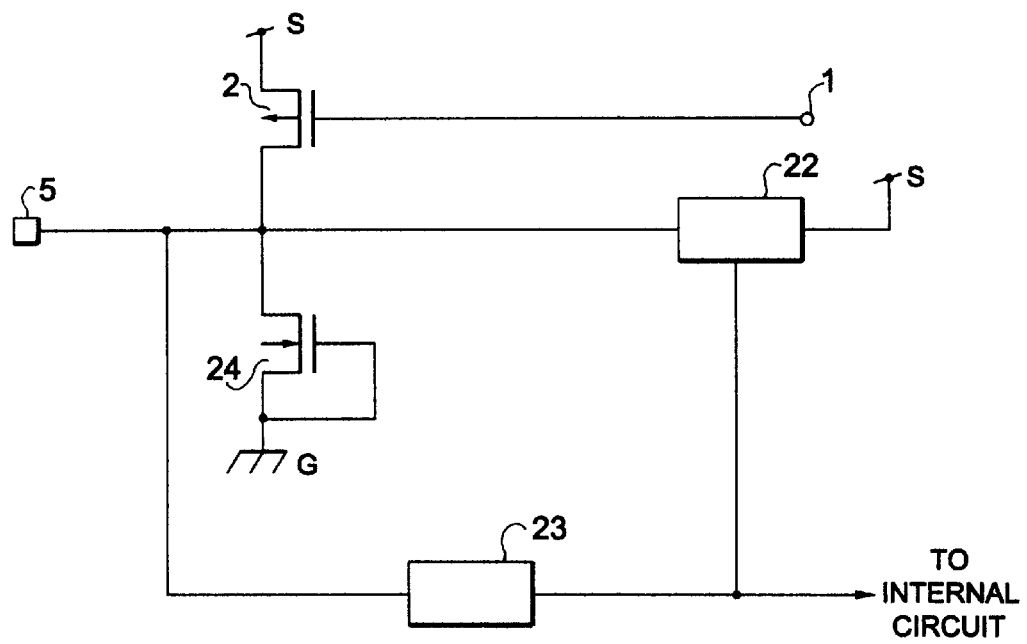

In the circuit variation, as shown in FIG. 6(b), an open drain type output circuit comprises a FET 24 whose gate is connected to its source terminal, a switch circuit 22 performing the same function as the FET 10 shown in FIG. 2, and an input circuit 23 performing the same function as the inverter 9 shown in FIG. 2. The FET 11 shown in FIG. 2 (and FIG. 6 (a)) is deleted.

The I/O circuits of this embodiment attain the same advantages as those of the second embodiment shown in FIG. 2. Namely, according to the present invention, only when the high impedance state is input to the I/O terminal 5 and the I/O terminal 5 is in an open state or the same potential level as pull-up potential is provided to the I/O terminal, the I/O terminal 5 is pulled up. Therefore leak current in the pull-down or pull-up operation can be prevented and power consumption is reduced.

While there has been shown and described various embodiments of the present invention it will be evident to those skill in the art that various modification may be made thereto without departing from the scope of the invention which is set forth in the appended claims.

What is claimed is:

1. An input/output circuit of a semiconductor device comprising:

an open drain type output circuit having a field effect transistor whose gate is connected to its source terminal and which outputs a state of a first level or a state of a second level different from the first level or a high impedance state, the output circuit having a control means to control the output states and having an output terminal;

an input/output terminal connected to the output terminal of the output circuit;

an input circuit having an input terminal connected to the input/output terminal and an output terminal connected to internal circuits; and a switch circuit connected between the input/output terminal and a power source supplying the first level, having a switching node connected to the output terminal of the input circuit;

wherein the switch circuit turns on when the input/output terminal is provided the state of the first level;

the switch circuit turns on when the input/output terminal is open state and the output circuit outputs the high impedance state; and the switch circuit turns off when the input/output terminal is provided the state of the second level.

2. An input/output circuit of a semiconductor device comprising:

an output circuit which outputs a state of a first level or a state of a second level different from the first level or a high impedance state, the output circuit having a control means to control the output states and having an output terminal;

an input/output terminal connected to the output terminal of the output circuit;

an input circuit having an input terminal connected to the input/output terminal and an output terminal connected to internal circuits; and a switch circuit connected between the input/output terminal and a power source supplying the first level, having a switching node connected to the output terminal of the input circuit; the switch circuit comprising a first MOS-FET, whose source is connected to the power source of the first level, whose drain is connected to the input/output terminal and whose gate is connected to the output terminal of the input circuit and a second MOS-FET, whose source is connect to the drain of the first MOS-FET, whose drain is connected to the input/output terminal and whose gate is connected to the control means;

wherein the switch circuit turns on when the input/output terminal is provided the state of the first level;

the switch circuit turns on when the input/output terminal is open state and the output circuit outputs the high impedance state; and the switch circuit turns off when the input/output terminal is provided the state of the second level.

3. An input/output circuit of a semiconductor device according to claim 2, wherein the control means consists of a first control terminal and a second control terminal, and the output circuit comprises:

a CMOS connected between the power source supplying the first level and a power source supplying the second level, a gate of one MOS in the CMOS connected to the first control terminal and a gate of the other MOS in the CMOS connected to the second control terminal.

4. An input/output circuit of a semiconductor device according to claim 2, wherein the output circuit has two control terminals, the output circuit outputting the state of the first level or the state of the second level when the both control terminals are provided the same level signal, and the output circuit outputs the high impedance state when the control terminals are provided different level signals.

5. An input/output circuit of a semiconductor device according to claim 4, wherein the control means comprises a buffer circuit.

* * * * *